(12) United States Patent
Hong et al.

(10) Patent No.: US 11,428,713 B2
(45) Date of Patent: Aug. 30, 2022

(54) PRINTED CIRCUIT BOARD, AND APPARATUS FOR MEASURING QUALITY OF PRINTED CIRCUIT BOARD

(71) Applicant: Samsung Electronics Co., Ltd., Suwon-si (KR)

(72) Inventors: Eun Seok Hong, Suwon-si (KR); Sung Jin Kim, Busan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 196 days.

(21) Appl. No.: 16/650,695

(22) PCT Filed: Sep. 21, 2018

(86) PCT No.: PCT/KR2018/011257
§ 371 (c)(1),
(2) Date: Mar. 25, 2020

(87) PCT Pub. No.: WO2019/066410
PCT Pub. Date: Apr. 4, 2019

(65) Prior Publication Data
US 2020/0319230 A1 Oct. 8, 2020

(30) Foreign Application Priority Data

Sep. 29, 2017 (KR) .................. 10-2017-0127552

(51) Int. Cl.
*H05K 1/02* (2006.01)
*G01R 1/067* (2006.01)
(Continued)

(52) U.S. Cl.
CPC .......... *G01R 1/06772* (2013.01); *G01B 7/26* (2013.01); *H01Q 1/38* (2013.01); *H01Q 9/045* (2013.01);
(Continued)

(58) Field of Classification Search
CPC . G01B 5/18; G01B 7/26; G01B 11/22; G01B 13/14; G01B 21/18; H05K 1/024
See application file for complete search history.

(56) References Cited

U.S. PATENT DOCUMENTS

| 8,723,732 B2 | 5/2014 | Lee et al. |
| 9,391,370 B2 | 7/2016 | Tzanidis et al. |

(Continued)

FOREIGN PATENT DOCUMENTS

| JP | 2011-061490 A | 3/2011 |
| JP | 2011114372 A | 6/2011 |

(Continued)

OTHER PUBLICATIONS

Machine translation of JP 2015-139042 Jul. 2015 (Year: 2015).*

(Continued)

*Primary Examiner* — Jeremy C Norris

(57) ABSTRACT

A printed circuit board according to various embodiments of the disclosure includes a plurality of layers in which at least one opening is formed and at least one antenna included in at least one layer among the plurality of layers, and the at least one opening is located within a specified distance from the at least one antenna and is formed through at least one of the plurality of layers.

14 Claims, 14 Drawing Sheets

(51) Int. Cl.
  *H01Q 1/38*      (2006.01)
  *H01Q 9/04*      (2006.01)
  *G01B 7/26*      (2006.01)

(52) U.S. Cl.
  CPC ......... *H05K 1/024* (2013.01); *H05K 1/0268* (2013.01); *G01R 1/0675* (2013.01); *H05K 2201/09063* (2013.01); *H05K 2201/10098* (2013.01)

(56) References Cited

U.S. PATENT DOCUMENTS

| | | | |
|---|---|---|---|
| 9,435,636 B1* | 9/2016 | Bumgardner | ............ G01B 3/28 |
| 10,122,088 B2 | 11/2018 | Aoki et al. | |
| 2011/0248890 A1 | 10/2011 | Lee et al. | |
| 2016/0336654 A1 | 11/2016 | Aoki et al. | |

FOREIGN PATENT DOCUMENTS

| | | |
|---|---|---|
| JP | 2014-107746 A | 6/2014 |
| JP | 2015-139042 A | 7/2015 |
| KR | 10-2011-0114372 A | 10/2011 |
| KR | 10-2016-0092408 A | 8/2016 |
| KR | 10-2017-0016377 A | 2/2017 |

OTHER PUBLICATIONS

ISA/KR, International Search Report and Written Opinion of the International Searching Authority, International Application No. PCT/KR2018/011257, dated Jan. 18, 2019, 13 pages.

Notice of Patent Allowance dated May 24, 2022 in connection with Korean Patent Application No. 10-2017-0127552, 10 pages.

* cited by examiner ically connected with the communication circuitry and the memory, and the processor is configured to measure the quality of the printed circuit board using at least one opening that is formed in the printed circuit board and that is empty inside.

PRINTED CIRCUIT BOARD, AND APPARATUS FOR MEASURING QUALITY OF PRINTED CIRCUIT BOARD

CROSS-REFERENCE TO RELATED APPLICATIONS

This application is a 371 National Stage of International Application No. PCT/KR2018/011257, filed Sep. 21, 2018, which claims priority to Korean Patent Application No. 10-2017-0127552, filed Sep. 29, 2017, the disclosures of which are herein incorporated by reference in their entirety.

BACKGROUND

1. Field

The disclosure relates to a printed circuit board including a plurality of layers, and a device for measuring the quality of a printed circuit board.

2. Description of Related Art

In order to meet the demands for compactness of electronic devices, parts included in the electronic devices have also been made compact and integrated. Accordingly, most of electronic devices include a printed circuit board (PCB) that is capable of stably connecting components included in the electronic devices within a limited space. In particular, recently, a multilayer printed circuit board including a plurality of layers has been used for more efficient space utilization.

SUMMARY

Because the multilayer printed circuit board includes the plurality of layers, a manufacturing process may be complex, and there may be a high probability that a defect is caused by a manufacturing tolerance. In particular, in the case where the multiplayer printed circuit board includes an antenna therein, the performance of the antenna may be affected by a manufacturing tolerance.

Accordingly, the manufacturing tolerance may be managed when the printed circuit board is manufactured, and the quality of the printed circuit board depending on the manufacturing tolerance between the plurality of layers included in the printed circuit board may be measured by sampling some products and performing a fracture analysis or by coupling the printed circuit board and other parts and thereafter testing the performance of a specific function.

Various embodiments of the disclosure provide a printed circuit board for more accurately and rapidly measuring the quality of the printed circuit board, a manufacturing method thereof, and a method for measuring the quality of a printed circuit board.

A printed circuit board according to various embodiments of the disclosure includes a plurality of layers in which at least one opening is formed and at least one antenna included in at least one layer among the plurality of layers, and the at least one opening is located within a specified distance from the at least one antenna and is formed through at least one of the plurality of layers.

A device for measuring quality of a printed circuit board according to various embodiments of the disclosure includes communication circuitry that communicates with an external electronic device, a memory, and a processor electrically connected with the communication circuitry and the memory, and the processor is configured to measure the quality of the printed circuit board using at least one opening that is formed in the printed circuit board and that is empty inside.

A method for manufacturing a printed circuit board according to various embodiments of the disclosure includes a process of forming a first non-conductive layer on a first conductive layer, a process of forming a second conductive layer on the first non-conductive layer, a process of forming an oxide on a surface of the second conductive layer, a process of forming at least one first opening through the second conductive layer and the first non-conductive layer, a process of removing the oxide formed on the surface of the second conductive layer, and a process of forming at least one antenna pattern on the second conductive layer. The first opening is formed within a specified distance from the at least one antenna pattern.

According to the various embodiments of the disclosure, the quality of the printed circuit board may be accurately and rapidly measured in the process of manufacturing the PCB or by the manufactured printed circuit board itself. Accordingly, product yield and manufacturing cost may be reduced, and stable performance may be ensured.

DETAILED DESCRIPTION

Figure 1:
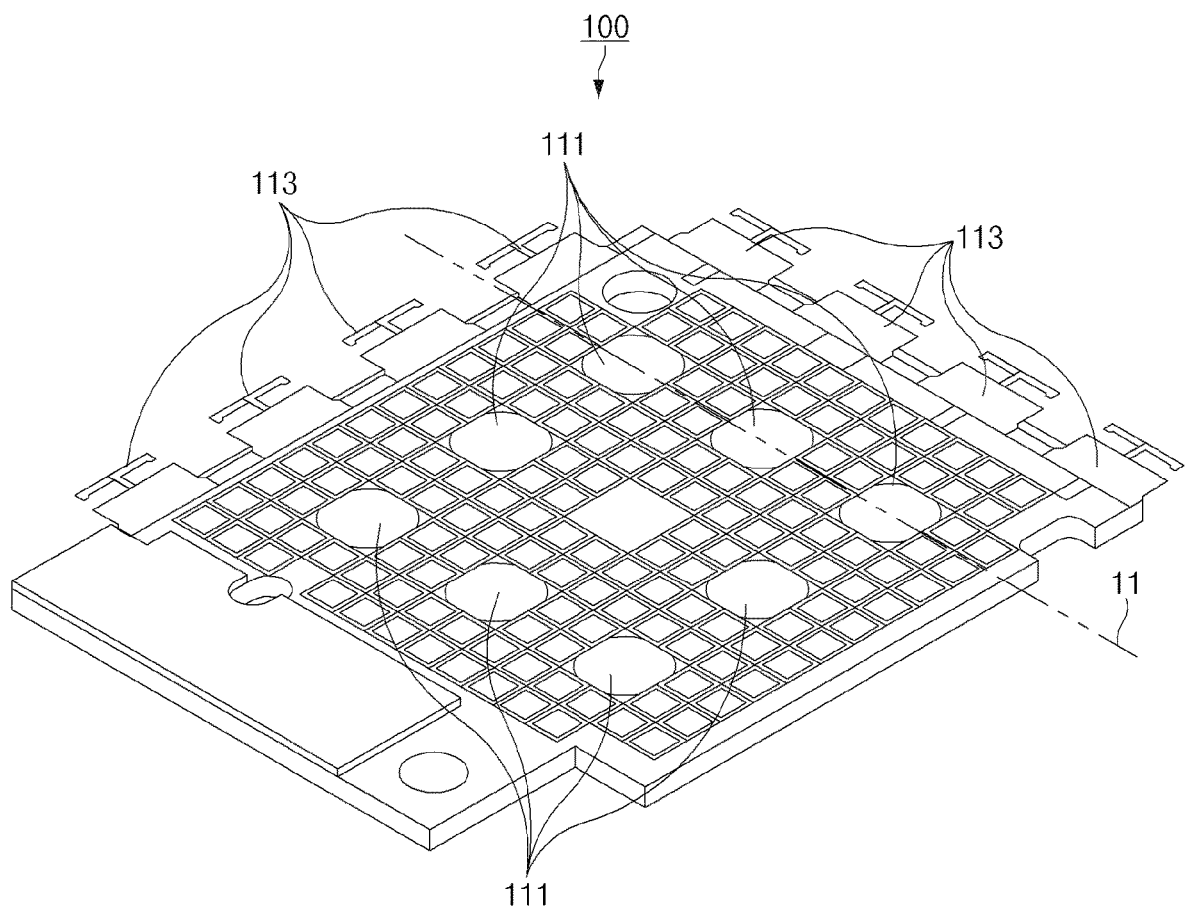
FIG. 1 is a view illustrating a structure of a printed circuit board according to various embodiments of the disclosure.

FIG. 1 is a view illustrating a structure of a printed circuit board according to various embodiments of the disclosure.

Referring to FIG. 1, the printed circuit board 100 may include at least one (e.g., a plurality of) antenna 111 or 113. According to an embodiment, the printed circuit board 100 may be a multilayer printed circuit board including a plurality of layers. According to an embodiment, the at least one antenna 111 or 113 may be included in at least one layer among the plurality of layers. According to an embodiment, the at least one antenna 111 or 113 may include at least one of a dipole antenna and a patch antenna. According to an embodiment, the at least one antenna 111 or 113 may transmit and receive signals in a 5-generation (5G) frequency band (e.g., about 28 GHz).

According to an embodiment, the at least one antenna 111 or 113 may be electrically connected with communication circuitry (not illustrated) that is included in the printed circuit board 100 or is disposed on a rear surface or a side surface of the printed circuit board 100. According to an embodiment, the at least one antenna 111 or 113 may be electrically connected with the communication circuitry through a feeding part (not illustrated). The communication circuitry may apply current to a feeding part 124-3 and may transmit/receive signals in a specified frequency band (e.g., about 28 GHz) based on an electrical path formed through the feeding part and the antenna.

Figure 2:
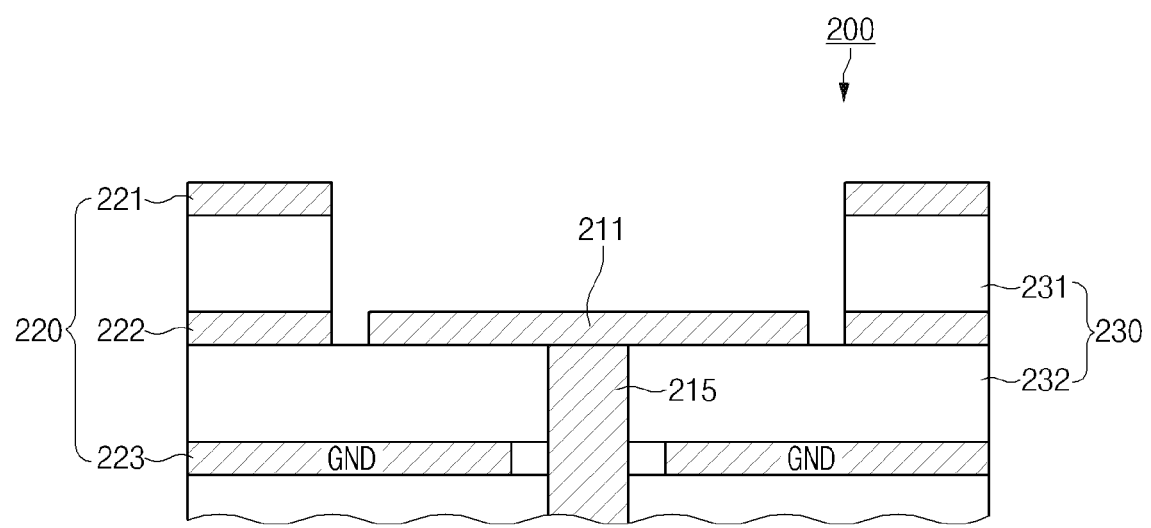
FIG. 2 illustrates a sectional view of a printed circuit board according to an embodiment of the disclosure.

FIG. 2 illustrates a sectional view of a printed circuit board according to an embodiment of the disclosure.

The sectional view of the printed circuit board 200 illustrated in FIG. 2 represents, for example, an example of a cut section obtained by cutting the printed circuit board 100 along a line 11 across the printed circuit board 100 illustrated in FIG. 1. Referring to FIG. 2, the printed circuit board 200 may include a plurality of layers 220 and 230, at least one antenna 211 (e.g., the at least one antenna 111 or 113 of FIG. 1), and a via hole (a conductive via hole) 215. According to an embodiment, the printed circuit board 200 may include the plurality of conductive layers (e.g., copper foils) 220 and the plurality of non-conductive layers (e.g., prepregs) 230 disposed between the plurality of conductive layers 220. For example, the plurality of conductive layers 220 and the plurality of non-conductive layers 230 may be disposed to alternate with each other. The plurality of conductive layers 220 may contain a conductive material (e.g., copper). The plurality of non-conductive layers 230 may contain a non-conductive material (e.g., a thermosetting resin or a glass fiber). According to an embodiment, the at least one antenna 211 may be included in at least one layer among the conductive layers 220.

According to an embodiment, the plurality of conductive layers 220 may include a first conductive layer 221, a second conductive layer 222, and a third conductive layer 223. According to an embodiment, the plurality of non-conductive layers 230 may include a first non-conductive layer 231 and a second non-conductive layer 232. According to an embodiment, the printed circuit board 200 may further include at least one conductive layer or at least one non-conductive layer, in addition to the first conductive layer 221, the first non-conductive layer 231, the second conductive layer 222, the second non-conductive layer 232, and the third conductive layer 223. According to an embodiment, the first conductive layer 221 may be disposed on an upper surface of the printed circuit board 200, the second conductive layer 222 may be disposed below the first conductive layer 221, and the third conductive layer 223 may be disposed below the second conductive layer 222. According to an embodiment, the first non-conductive layer 231 may be disposed between the first conductive layer 221 and the second conductive layer 222, and the second non-conductive layer 232 may be disposed between the second conductive layer 222 and the third conductive layer 223.

According to an embodiment, the at least one antenna 211 may be included in the second conductive layer 222. According to an embodiment, the third conductive layer 223 may include a ground GND. According to an embodiment, the opening 215 may electrically connect the plurality of conductive layers included in the printed circuit board. For example, the opening 215 may be filled with a conductive material to connect the at least one antenna 211 formed in the second conductive layer 222 with a different conductive layer (or, a wiring pattern formed in the different conductive layer).

As described above with reference to FIG. 1, the at least one antenna 211 included in the printed circuit board 200 may operate as an antenna for 5G communication. Due to the nature of a 5G antenna to which the beamforming technology is applied and that operates at high frequency, the frequency characteristic of the at least one antenna 211 may be greatly changed depending on the intervals between the plurality of conductive layers. The characteristic of the antenna 211 may be changed by a tolerance in the process of manufacturing the printed circuit board 200, and therefore the antenna 211 may be defective. The tolerance may refer to, for example, a difference between the thickness of the plurality of layers (or, the distance between the plurality of layers) that has been set in the process of designing the printed circuit board 200 and the thickness of the plurality of layers (or, the distance between the plurality of layers) of the actually manufactured printed circuit board 200. For example, in the case where the thickness of the first non-conductive layer 231 differs from the designed thickness, the distance between the second conductive layer 222 in which the antenna 211 is included and the first conductive layer 221 may be changed, and therefore the characteristic of the antenna 211 may be changed. In another example, in the case where the thickness of the second non-conductive layer 232 differs from the designed thickness, the distance between the second conductive layer 222 in which the antenna 211 is included and the third conductive layer 223 may be changed, and therefore the characteristic of the antenna 211 may be changed.

Figure 3:
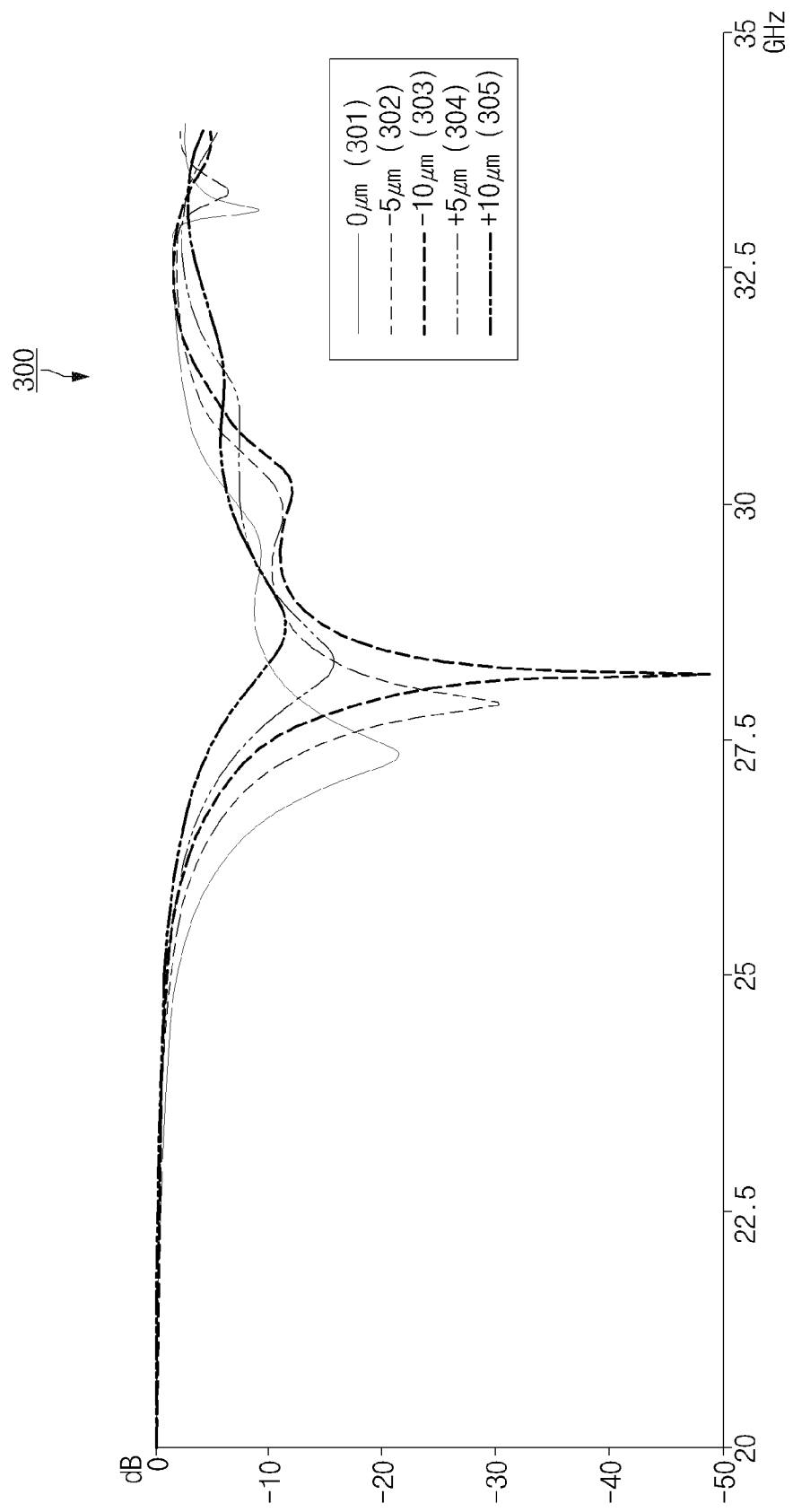
FIG. 3 is a view illustrating a frequency characteristic of an antenna depending on a manufacturing tolerance of a printed circuit board.

FIG. 3 is a view illustrating a frequency characteristic of an antenna depending on a manufacturing tolerance of a printed circuit board.

A frequency characteristic graph 300 illustrated in FIG. 3 may correspond to an example of a frequency characteristic of the antenna 211 depending on a manufacturing tolerance between the first conductive layer 221 and the second conductive layer 222 illustrated in FIG. 2. In the case where there is no manufacturing tolerance between the first conductive layer 221 and the second conductive layer 222, the interval between the first conductive layer 221 and the second conductive layer 222 may be 115 μm. The x-axis of the frequency characteristic graph 300 represents frequency, and the y axis represents signal level. A plurality of frequency characteristic curves illustrated in FIG. 3 may include a frequency characteristic curve 301 when there is no manufacturing tolerance, a frequency characteristic curve 302 when a tolerance of −5 μm is included, a frequency characteristic curve 303 when a tolerance of −10 μm is included, a frequency characteristic curve 304 when a tolerance of 5 μm is included, and a frequency characteristic curve 305 when a tolerance of 10 μm is included.

Referring to FIG. 3, it can be seen that when the minus (−) tolerances (e.g., −5 μm and −10 μm) and the plus (+) tolerances occur, the center frequencies are higher than the center frequency when there is no tolerance. Furthermore, it can be seen that the amount of movement of the center frequency is increased with an increase in the magnitude of the tolerance and, when the plus (+) tolerances occur, the amounts of movement of the center frequencies are larger than those when the minus (−) tolerances (e.g., −5 μm and −10 μm) occur.

As described above with reference to FIG. 3, due to the manufacturing tolerance of the printed circuit board, the frequency characteristic of the antenna included in the printed circuit board may be changed, which results in an unintended defect. In particular, due to the nature of a 5G antenna, the frequency characteristic of the antenna may be greatly changed even by a minute manufacturing tolerance, and therefore the manufacturing tolerance needs to be strictly managed.

The quality of a printed circuit board depending on manufacturing tolerances between a plurality of layers included in the printed circuit board may be measured by a fracture analysis or by completing an antenna module including the printed circuit board and thereafter identifying the performance of the antenna module. The qualities of printed circuit boards according to various embodiments of the disclosure may be measured in the process of manufacturing the printed circuit boards or by the manufactured printed circuit boards themselves, without a fracture analysis or identification of the performance through an antenna module.

Figure 4:
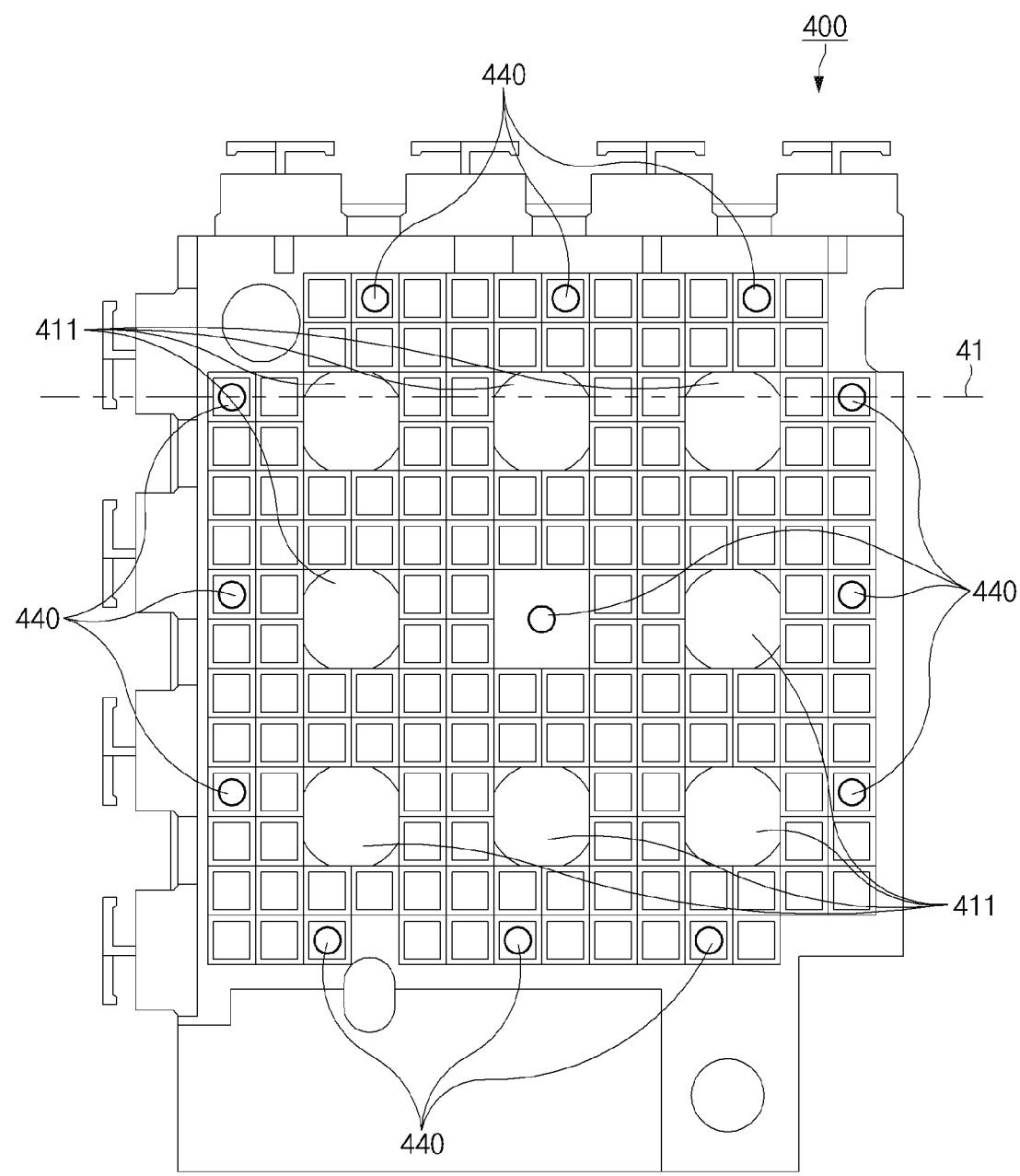
FIG. 4 is a view illustrating a structure of a printed circuit board according to various embodiments of the disclosure.

FIG. 4 is a view illustrating a structure of a printed circuit board according to various embodiments of the disclosure.

Referring to FIG. 4, the printed circuit board 400 (e.g., the printed circuit board of FIG. 1) may include at least one (e.g., a plurality of) antenna 411 (e.g., the antenna 211 of FIG. 2). According to an embodiment, the printed circuit board 400 may be a multilayer printed circuit board including a plurality of layers. According to an embodiment, the at least one antenna 411 may be included in at least one layer among the plurality of layers. According to an embodiment, the at least one antenna 411 may include at least one of a dipole antenna and a patch antenna. According to an embodiment, the at least one antenna 411 may transmit and receive signals in a 5-generation (5G) frequency band (e.g., about 28 GHz).

According to an embodiment, the printed circuit board 400 may include at least one opening (e.g., via hole or empty via hole) 440 formed through at least one of the plurality of layers included in the printed circuit board 400. According to an embodiment, the at least one opening may be empty inside. For example, unlike a conductive via hole (e.g., the via hole 215 of FIG. 2) that is filled with a conductive material to electrically connect a plurality of conductive layers included in a printed circuit board, the at least one opening 440 may be empty inside for the purpose of identifying a manufacturing tolerance of the printed circuit board. According to an embodiment, the at least one opening 440 may be located within a specified distance from the at least one antenna 411. For example, the at least one opening 440 may be formed in a position to replace the antenna 411 so as to recognize a manufacturing tolerance between layers (e.g., the first conductive layer 221 or the third conductive layer 223 of FIG. 2) that are different from the layer (e.g., the second conductive layer 222 of FIG. 2) in which the at least one antenna 411 is included. According to an embodiment, the at least one opening 440 may be formed in a position that does not affect the antenna characteristic of the antenna 411 or minimizes an influence on the antenna characteristic of the antenna 411. According to an embodiment, the number of openings 440 may be determined based on at least one of the size of the printed circuit board 400, the size of the antenna 411, the number of antennas 411, and the position of the antenna 411.

Figure 5:
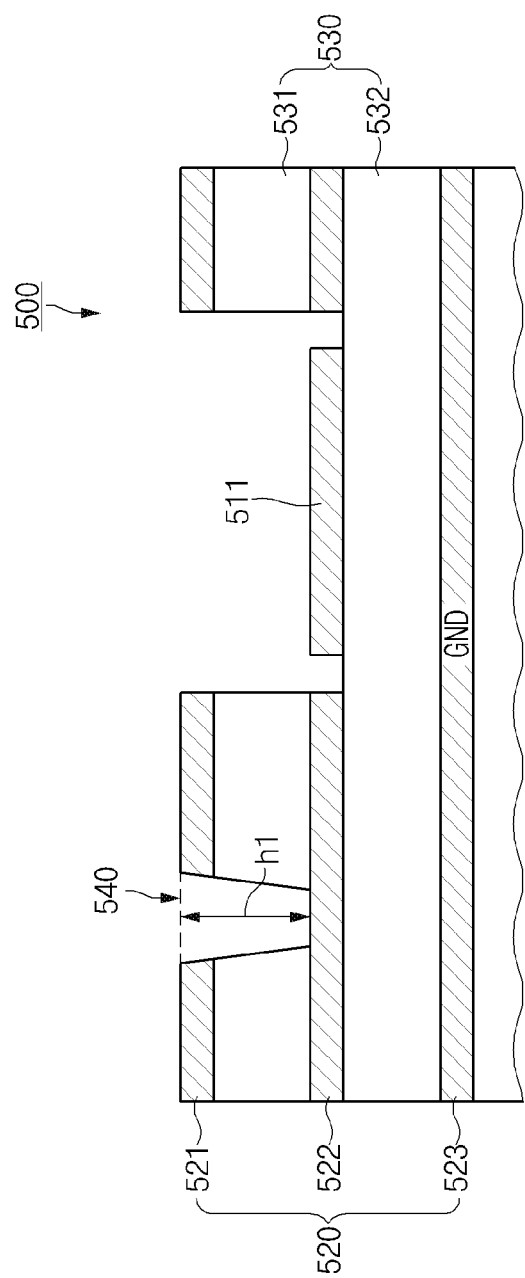
FIGS. 5 to 10 illustrate sectional views of printed circuit boards according to an embodiment of the disclosure.

FIG. 5 illustrates a sectional view of a printed circuit board according to an embodiment of the disclosure.

The sectional view of the printed circuit board 500 illustrated in FIG. 5 represents, for example, an example of a cut section obtained by cutting the printed circuit board 400 along a line 41 across the printed circuit board 400 illustrated in FIG. 4. Referring to FIG. 5, the printed circuit board 500 may include a plurality of layers 520 and 530, at least one antenna 511 (e.g., the at least one antenna 411 of FIG. 4), and at least one opening 540 (e.g., the at least one opening 440 of FIG. 4). For example, the printed circuit board 500 may include the plurality of conductive layers 520 and the plurality of non-conductive layers 530 disposed between the plurality of conductive layers 520. According to an embodiment, the plurality of conductive layers 520 may include a first conductive layer 521, a second conductive layer 522, and a third conductive layer 523. According to an embodiment, the plurality of non-conductive layers 530 may include a first non-conductive layer 531 and a second non-conductive layer 532. According to an embodiment, the at least one antenna 511 may be included in the second conductive layer 522. According to an embodiment, the third conductive layer 523 may include a ground GND.

According to an embodiment, the at least one opening 540 may be formed through the first conductive layer 521 and the first non-conductive layer 531. According to an embodiment, the at least one opening 540 may have a first depth value h1 corresponding to the thicknesses of the first conductive layer 521 and the first non-conductive layer 531. For example, the first depth value h1 may correspond to the distance from the surface of the printed circuit board 500 to the second conductive layer 522 in which the antenna is included. According to an embodiment, the at least one opening 540 may be empty inside. According to an embodiment, the at least one opening 540 may have a circular cylindrical shape or a frusto-circular conical shape. However, the form or shape of the opening 540 is not limited to a specific form, and the opening 540 may be formed in various forms.

Figure 6:
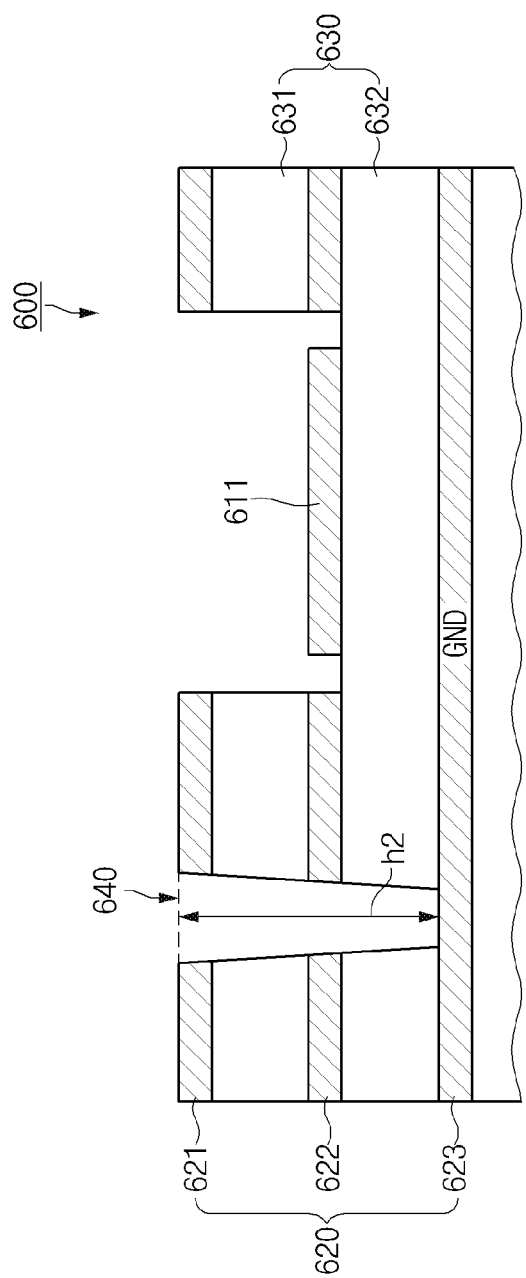

FIG. 6 illustrates a sectional view of a printed circuit board according to an embodiment of the disclosure.

The sectional view of the printed circuit board 600 illustrated in FIG. 6 represents, for example, another example of the cut section obtained by cutting the printed circuit board 400 along the line 41 across the printed circuit board 400 illustrated in FIG. 4. Referring to FIG. 6, the printed circuit board 600 may include a plurality of layers 620 and 630 (e.g., the plurality of layers 520 and 530 of FIG. 5), at least one antenna 611 (e.g., the at least one antenna 411 of FIG. 4), and at least one opening 640 (e.g., the at least one opening 440 of FIG. 4). For example, the printed circuit board 600 may include the plurality of conductive layers 620 and the plurality of non-conductive layers 630 disposed between the plurality of conductive layers 620. According to an embodiment, the plurality of conductive layers 620 may include a first conductive layer 621, a second conductive layer 622, and a third conductive layer 623. According to an embodiment, the plurality of non-conductive layers 630 may include a first non-conductive layer 631 and a second non-conductive layer 632. According to an embodiment, the at least one antenna 611 may be included in the second conductive layer 622. According to an embodiment, the third conductive layer 623 may include a ground GND.

According to an embodiment, the at least one opening 640 may be formed through the first conductive layer 621, the first non-conductive layer 631, the second conductive layer 622, and the second non-conductive layer 632. According to an embodiment, the at least one opening 640 may have a second depth value h2 corresponding to the thicknesses of the first conductive layer 621, the first non-conductive layer 631, the second conductive layer 622, and the second non-conductive layer 632. For example, the second depth value h2 may correspond to the distance from the surface of the printed circuit board 600 to the third conductive layer 623 in which the ground is included. According to an embodiment, the at least one opening 640 may be empty inside. According to an embodiment, the at least one opening 640 may have a circular cylindrical shape or a frusto-circular conical shape. However, the form or shape of the opening 640 is not limited to a specific form, and the opening 640 may be formed in various forms.

Figure 7:
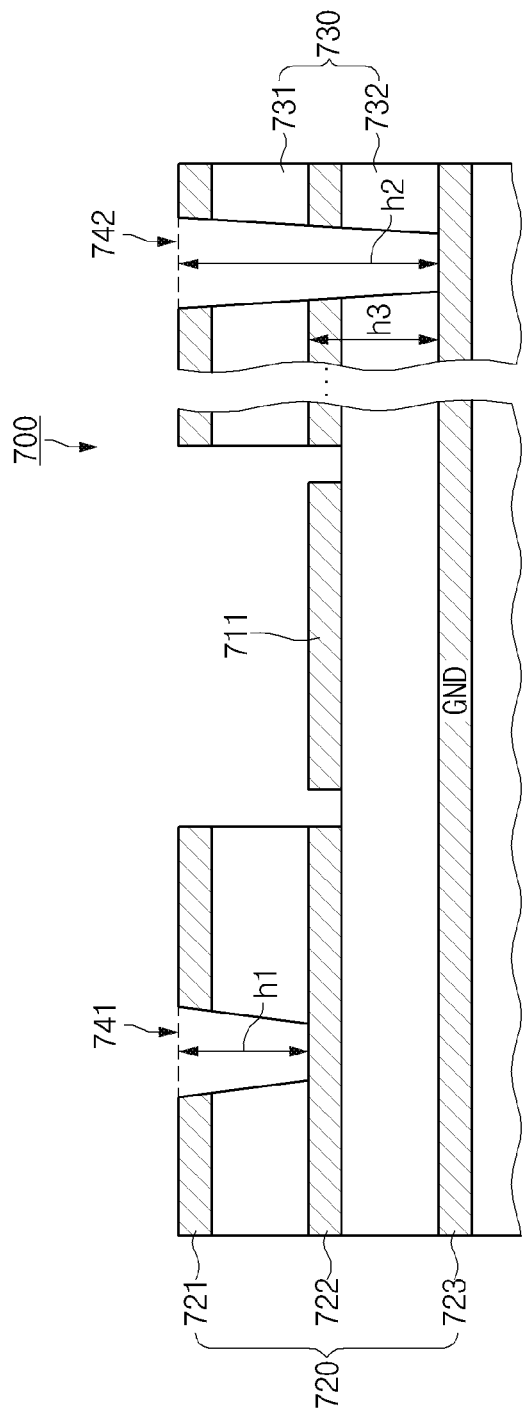

FIG. 7 illustrates a sectional view of a printed circuit board according to an embodiment of the disclosure.

The sectional view of the printed circuit board 700 illustrated in FIG. 7 represents, for example, another example of the cut section obtained by cutting the printed circuit board 400 along the line 41 across the printed circuit board 400 illustrated in FIG. 4. Referring to FIG. 7, the printed circuit board 700 may include a plurality of layers 720 and 730 (e.g., the plurality of layers 620 and 630 of FIG. 6), at least one antenna 711 (e.g., the at least one antenna 411 of FIG. 4), and a plurality of openings 741 and 742 (e.g., the at least one opening 440 of FIG. 4). For example, the printed circuit board 700 may include the plurality of conductive layers 720 and the plurality of non-conductive layers 730 disposed between the plurality of conductive layers 720. According to an embodiment, the plurality of conductive layers 720 may include a first conductive layer 721, a second conductive layer 722, and a third conductive layer 723. According to an embodiment, the plurality of non-conductive layers 730 may include a first non-conductive layer 731 and a second non-conductive layer 732. According to an embodiment, the at least one antenna 711 may be included in the second conductive layer 722. According to an embodiment, the third conductive layer 723 may include a ground GND.

According to an embodiment, the first opening 741 may be formed through the first conductive layer 721 and the first non-conductive layer 731. According to an embodiment, the first opening 741 may have a first depth value h1 corresponding to the thicknesses of the first conductive layer 721 and the first non-conductive layer 731. According to an embodiment, the second opening 742 may be formed through the first conductive layer 721, the first non-conductive layer 731, the second conductive layer 722, and the second non-conductive layer 732. According to an embodiment, the second opening 742 may have a second depth value h2 corresponding to the thicknesses of the first conductive layer 721, the first non-conductive layer 731, the second conductive layer 722, and the second non-conductive layer 732. According to an embodiment, a depth value h3 corresponding to the thicknesses of the second conductive layer 722 and the second non-conductive layer 732 may be calculated by subtracting the depth value h1 of the first opening 741 from the depth value h2 of the second opening 742. According to an embodiment, the plurality of openings 741 and 742 may be empty inside. According to an embodiment, the plurality of openings 741 and 742 may have a circular cylindrical shape or a frusto-circular conical shape. However, the form or shape of the opening 740 is not limited to a specific form, and the opening 740 may be formed in various forms.

Figure 8:
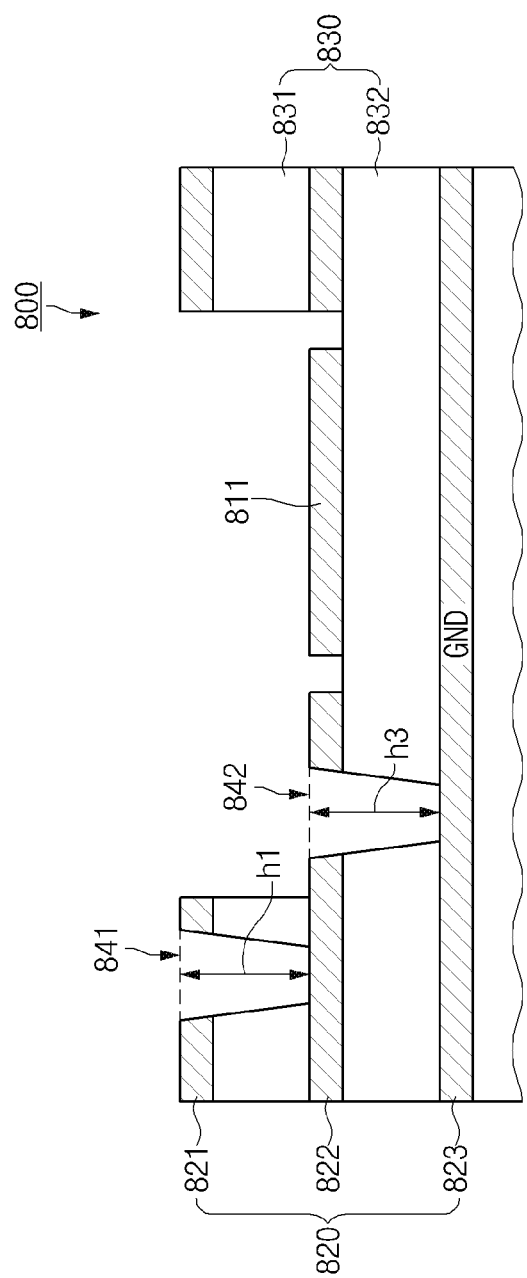

FIG. 8 illustrates a sectional view of a printed circuit board according to an embodiment of the disclosure.

The sectional view of the printed circuit board 800 illustrated in FIG. 8 represents, for example, another example of the cut section obtained by cutting the printed circuit board 400 along the line 41 across the printed circuit board 400 illustrated in FIG. 4. Referring to FIG. 8, the printed circuit board 800 may include a plurality of layers 820 and 830 (e.g., the plurality of layers 720 and 730 of FIG. 7), at least one antenna 811 (e.g., the at least one antenna 411 of FIG. 4), and a plurality of openings 841 and 842 (e.g., the at least one opening 440 of FIG. 4). For example, the printed circuit board 800 may include the plurality of conductive layers 820 and the plurality of non-conductive layers 830 disposed between the plurality of conductive layers 820. According to an embodiment, the plurality of conductive layers 820 may include a first conductive layer 821, a second conductive layer 822, and a third conductive layer 823. According to an embodiment, the plurality of non-conductive layers 830 may include a first non-conductive layer 831 and a second non-conductive layer 832. According to an embodiment, the at least one antenna 811 may be included in the second conductive layer 822. According to an embodiment, the third conductive layer 823 may include a ground GND.

According to an embodiment, the plurality of openings 841 and 842 may be formed from the surfaces of different layers. According to an embodiment, the first opening 841 may be formed from the surface of the first conductive layer 821 and may be formed through the first conductive layer 821 and the first non-conductive layer 831. According to an embodiment, the first opening 841 may have a first depth value h1 corresponding to the thicknesses of the first conductive layer 821 and the first non-conductive layer 831. According to an embodiment, the second opening 842 may be formed from the surface of the second conductive layer 822 and may be formed through the second conductive layer 822 and the second non-conductive layer 832. According to an embodiment, the second opening 842 may have a third depth value h3 corresponding to the thicknesses of the second conductive layer 822 and the second non-conductive layer 832. According to an embodiment, the plurality of openings 841 and 842 may be empty inside. According to an embodiment, the plurality of openings 841 and 842 may have a circular cylindrical shape or a frusto-circular conical shape. However, the form or shape of the opening 840 is not limited to a specific form, and the opening 840 may be formed in various forms.

Figure 9:
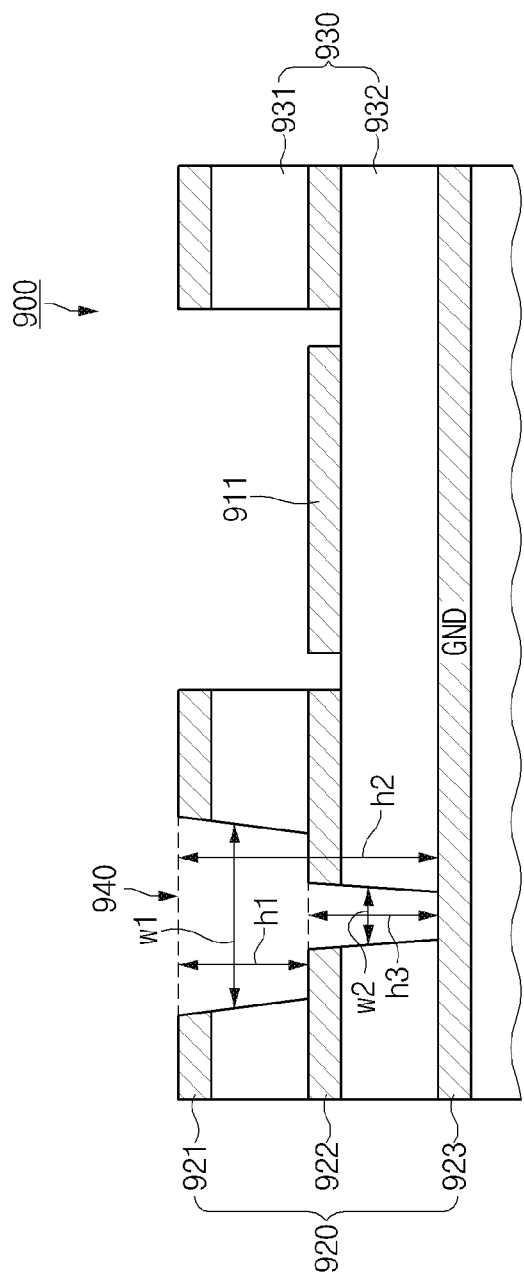

FIG. 9 illustrates a sectional view of a printed circuit board according to an embodiment of the disclosure.

The sectional view of the printed circuit board 900 illustrated in FIG. 9 represents, for example, another example of the cut section obtained by cutting the printed circuit board 400 along the line 41 across the printed circuit board 400 illustrated in FIG. 4. Referring to FIG. 9, the printed circuit board 900 may include a plurality of layers 920 and 930 (e.g., the plurality of layers 820 and 830 of FIG. 8), at least one antenna 911 (e.g., the at least one antenna 411 of FIG. 4), and at least one opening 940 (e.g., the at least one opening 440 of FIG. 4). For example, the printed circuit board 900 may include the plurality of conductive layers 920 and the plurality of non-conductive layers 930 disposed between the plurality of conductive layers 920. According to an embodiment, the plurality of conductive layers 920 may include a first conductive layer 921, a second conductive layer 922, and a third conductive layer 923. According to an embodiment, the plurality of non-conductive layers 930 may include a first non-conductive layer 931 and a second non-conductive layer 932. According to an embodiment, the at least one antenna 911 may be included in the second conductive layer 922. According to an embodiment, the third conductive layer 923 may include a ground GND.

According to an embodiment, the at least one opening 940 may be formed through the first conductive layer 921, the first non-conductive layer 931, the second conductive layer 922, and the second non-conductive layer 932. According to an embodiment, the at least one opening 940 may have a second depth value h2 corresponding to the thicknesses of the first conductive layer 921, the first non-conductive layer 931, the second conductive layer 922, and the second non-conductive layer 932. For example, the second depth value h2 may correspond to the distance from the surface of the printed circuit board 900 to the third conductive layer 923 in which the ground is included. According to an embodiment, the at least one opening 940 may be empty inside.

According to an embodiment, the at least one opening 940 may be formed to have a step structure in at least one layer. For example, referring to FIG. 8, the at least one opening 940 may have a step structure between the first non-conductive layer 931 and the second conductive layer 922. The at least one opening 940 may be formed to have a first width value w1 from the first conductive layer 921 to the first non-conductive layer 931 and may be formed to have a second width value w2 from the second conductive layer 922 to the second non-conductive layer 932. Accordingly, the at least one opening 940 may have a discontinuously decreasing width between the first non-conductive layer 931 and the second conductive layer 922.

Figure 10:
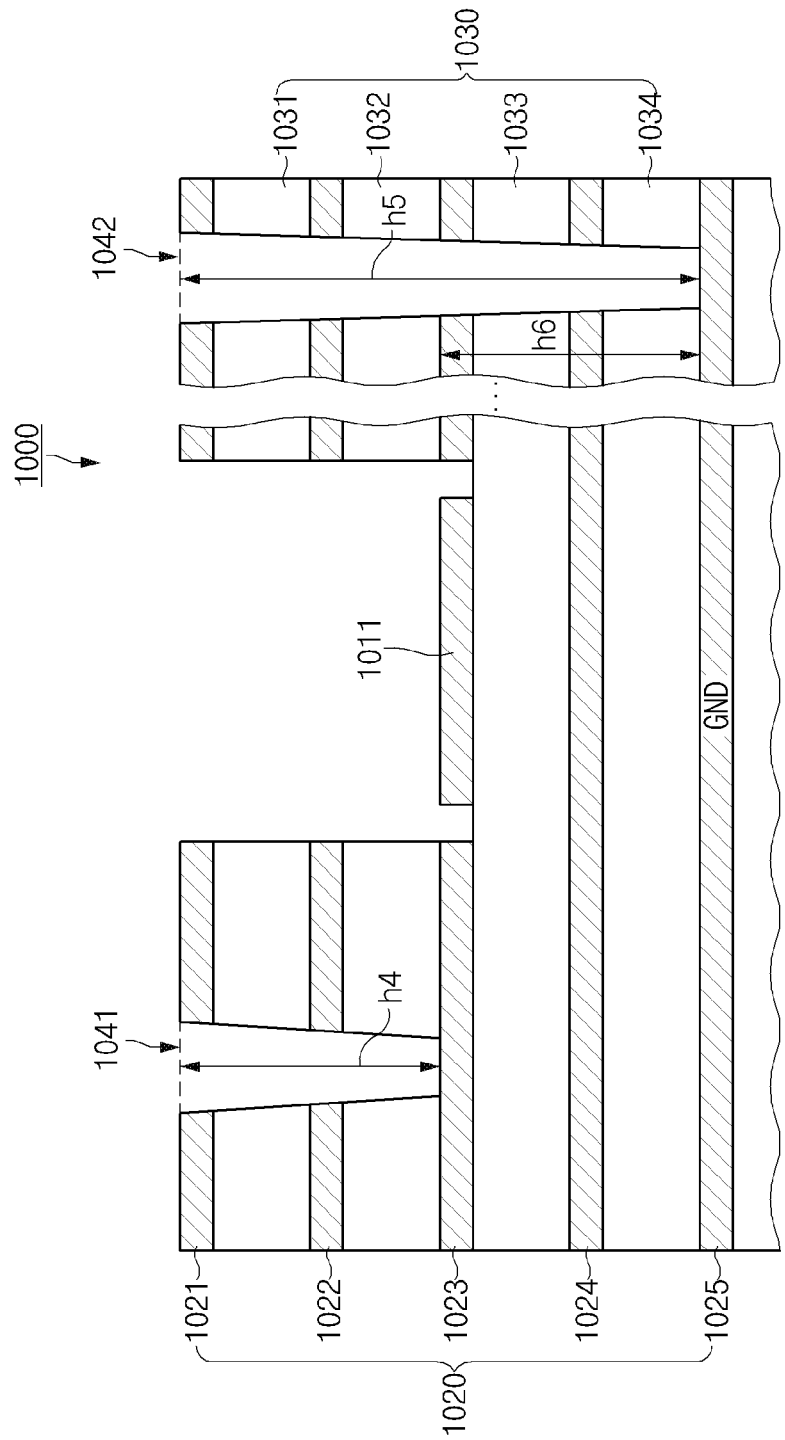

According to an embodiment, in the case where the at least one opening 940 has the step structure, a plurality of depth values h1, h2, and h3 may be measured by using the one opening 940. For example, the first depth value h1 corresponding to the thicknesses of the first conductive layer 921 and the first non-conductive layer 931, the second depth value h2 corresponding to the thicknesses of the first conductive layer 921, the first non-conductive layer 931, the second conductive layer 922, and the second non-conductive layer 932, and the third depth value h3 corresponding to the thicknesses of the second conductive layer 922 and the second non-conductive layer 932 may be measured by using the at least one opening 940. FIG. 10 illustrates a sectional view of a printed circuit board according to an embodiment of the disclosure.

The sectional view of the printed circuit board 1000 illustrated in FIG. 10 represents, for example, another example of the cut section obtained by cutting the printed circuit board 400 along the line 41 across the printed circuit board 400 illustrated in FIG. 4. Referring to FIG. 10, the printed circuit board 1000 may include a plurality of layers 1020 and 1030, at least one antenna 1011 (e.g., the at least one antenna 411 of FIG. 4), and a plurality of openings 1041 and 1042 (e.g., the at least one opening 440 of FIG. 4). For example, the printed circuit board 1000 may include the plurality of conductive layers 1020 and the plurality of non-conductive layers 1030 disposed between the plurality of conductive layers 1020. According to an embodiment, the plurality of conductive layers 1020 may include a first conductive layer 1021, a second conductive layer 1022, a third conductive layer 1023, a fourth conductive layer 1024, and a fifth conductive layer 1025. According to an embodiment, the plurality of non-conductive layers 1030 may include a first non-conductive layer 1031, a second non-conductive layer 1032, a third non-conductive layer 1033, and a fourth non-conductive layer 1034. According to an embodiment, the at least one antenna 1011 may be included in the third conductive layer 1023. According to an embodiment, the fifth conductive layer 1025 may include a ground GND.

According to an embodiment, the first opening 1041 may be formed through the first conductive layer 1021, the first non-conductive layer 1031, the second conductive layer 1022, and the second non-conductive layer 1032. According to an embodiment, the first opening 1041 may have a fourth depth value h4 corresponding to the thicknesses of the first conductive layer 1021, the first non-conductive layer 1031, the second conductive layer 1022, and the second non-conductive layer 1032. For example, the fourth depth value h4 may correspond to the distance from the surface of the printed circuit board 1000 to the third conductive layer 1023 in which the antenna is included. According to an embodiment, the second opening 1042 may be formed through the first conductive layer 1021, the first non-conductive layer 1031, the second conductive layer 1022, the second non-conductive layer 1032, the third conductive layer 1023, the third non-conductive layer 1033, the fourth conductive layer 1024, and the fourth non-conductive layer 1034. According to an embodiment, the second opening 1042 may have a fifth depth value h5 corresponding to the thicknesses of the first conductive layer 1021, the first non-conductive layer 1031, the second conductive layer 1022, the second non-conductive layer 1032, the third conductive layer 1023, the third non-conductive layer 1033, the fourth conductive layer 1024, and the fourth non-conductive layer 1034. For example, the fifth depth value h5 may correspond to the distance from the surface of the printed circuit board 1000 to the fifth conductive layer 1025 in which the ground is included. According to an embodiment, a depth value h6 corresponding to the thicknesses of the third conductive layer 1023, the third non-conductive layer 1033, the fourth conductive layer 1024, and the fourth non-conductive layer 1034 may be calculated by subtracting the depth value h4 of the first opening 1041 from the depth value h5 of the second opening 1042. According to an embodiment, the plurality of openings 1041 and 842 may be empty inside. According to an embodiment, the plurality of openings 1041 and 1042 may have a circular cylindrical shape or a frusto-circular conical shape. However, the form or shape of the opening 1040 is not limited to a specific form, and the opening 1040 may be formed in various forms.

According to the embodiments described above with reference to FIGS. 1 to 10, the at least one opening included in the printed circuit boards has been described as having one or two depth values (e.g., the first depth value h1 or the second depth value h2). However, the printed circuit boards may include a plurality of openings having three or more depth values.

Figure 14:
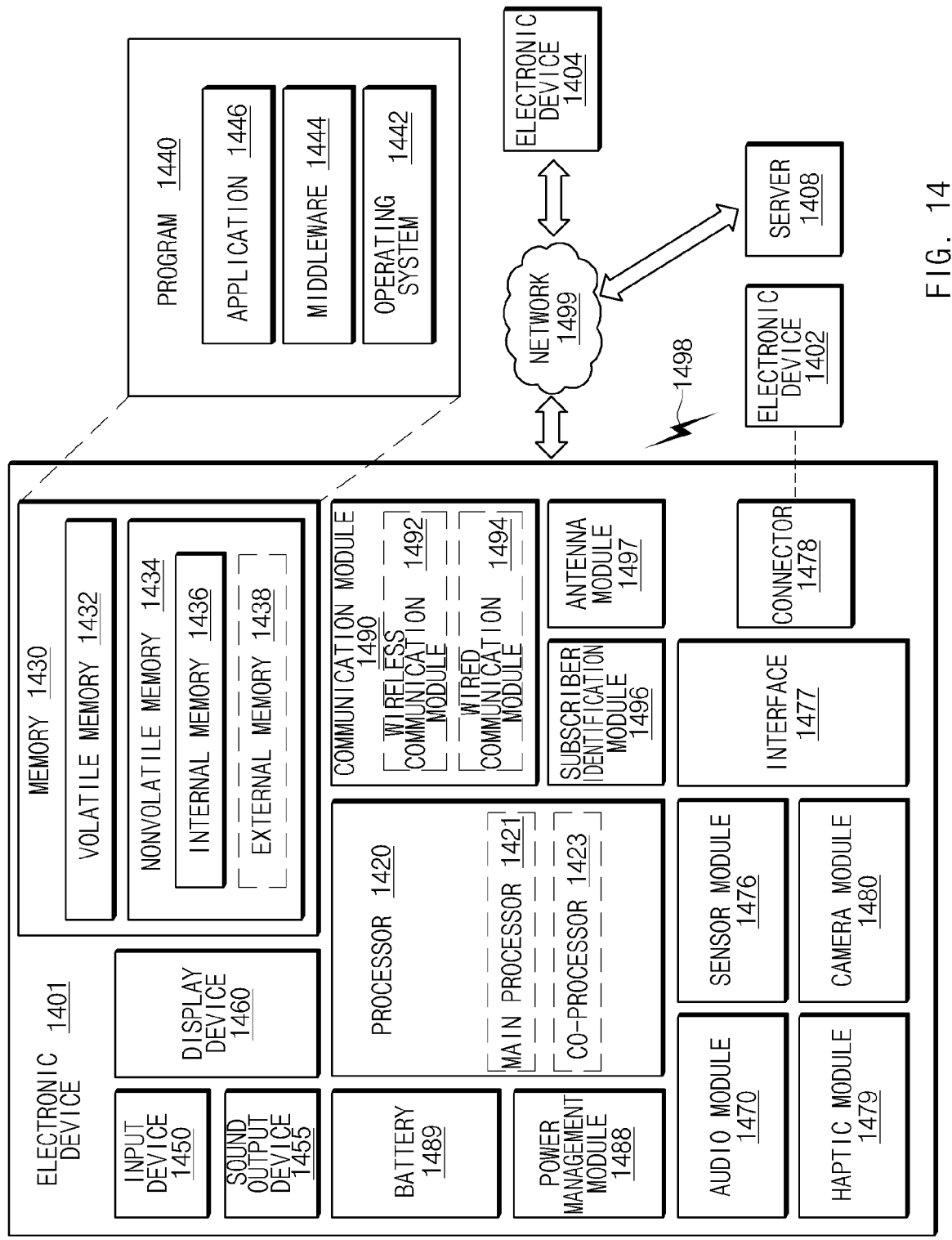
FIG. 14 is a block diagram of an electronic device in a network environment according to various embodiments.

The printed circuit boards according to the various embodiments of the disclosure, which have been described above with reference to FIGS. 1 to 10, may be included as a component of an electronic device (e.g., an electronic device 1401 of FIG. 14). For example, the printed circuit boards according to the various embodiments of the disclosure may electrically connect various components (e.g., a memory, a display, a processor, a sensor, and the like) that are included in the electronic device, and may transfer signals or commands between the various components.

Figure 11:
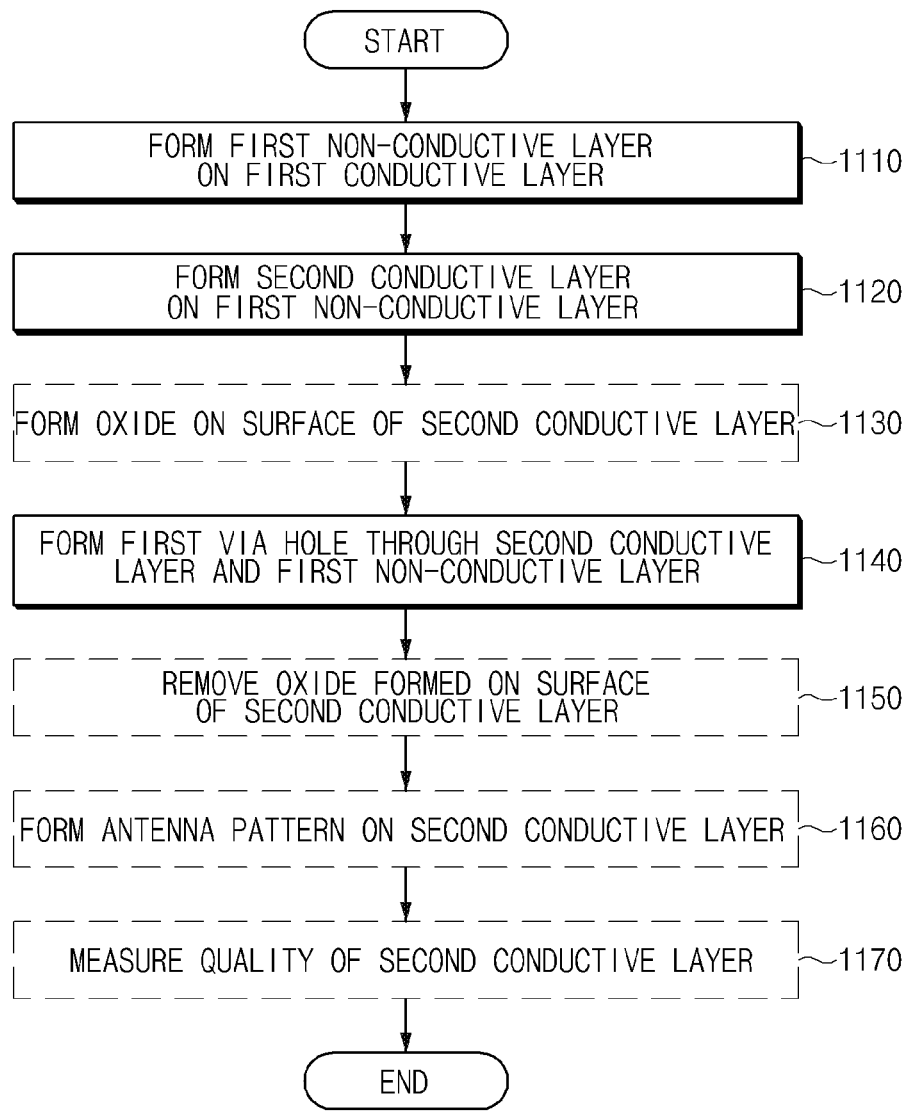
FIGS. 11 and 12 are flowcharts illustrating a method of manufacturing a printed circuit board according to various embodiments of the disclosure.

FIG. 11 is a flowchart illustrating a method of manufacturing a printed circuit board according to various embodiments of the disclosure.

According to an embodiment, in process 1110, a first non-conductive layer may be formed on a first conductive layer. According to an embodiment, in process 1120, a second conductive layer may be formed on the first non-conductive layer.

According to an embodiment, in process 1130, an oxide (e.g., a copper oxide) may be formed on the surface of the second conductive layer. For example, black oxide or brown oxide treatment may be performed on the second conductive layer.

According to an embodiment, in process 1140, at least one first opening may be formed through the second conductive layer and the first non-conductive layer. According to an embodiment, the at least one first opening may be formed by using a drill (e.g., an electric drill) or by using laser drilling.

According to an embodiment, in process 1150, the oxide formed on the surface of the second conductive layer may be removed. For example, the oxide formed on the surface of the second conductive layer may be removed through a pickling and/or rinsing process. According to an embodiment, process 1130 serves to prevent a laser from being diffusely reflected from the surface of a conductive layer when laser drilling is used, and process 1130 and process 1150 may be omitted in the case of forming the first opening using a drill.

According to an embodiment, in process 1160, at least one antenna pattern may be formed on the second conductive layer. For example, the at least one antenna pattern may be formed through exposing, developing, and etching processes. According to an embodiment, in process 1160, a wiring pattern, in addition to the antenna pattern, may be additionally formed on the second conductive layer. In the case of manufacturing a printed circuit board (e.g., the printed circuit board 500 of FIG. 5) that includes only an opening having a first depth h1, the at least one antenna pattern may be formed on the first conductive layer. Process 1160 may be omitted in the case where the antenna pattern is formed on the first conductive layer.

According to an embodiment, in process 1170, the quality of the second conductive layer may be measured. For example, foreign matter contained in the first opening formed through the second conductive layer may be inspected, or the widths and depths of the first opening, the antenna pattern, and the wiring pattern may be measured, through an automatic optical inspection (AOI) process or a process using a non-contact type micro-shape measurement device. According to an embodiment, process 1170 may be omitted.

According to an embodiment, the at least one opening included in the printed circuit board may be located within a specified distance from the at least one antenna. For example, the at least one first opening may be formed in a position that represents the at least one antenna (or antenna pattern). According to an embodiment, the at least one opening may be formed in a position that does not affect the antenna characteristic of the antenna or minimizes an influence on the antenna characteristic of the antenna. According to an embodiment, the number of first openings may be determined based on at least one of the size of the printed circuit board, the size of the antenna, the number of antennas, and the position of the antenna.

Figure 12:
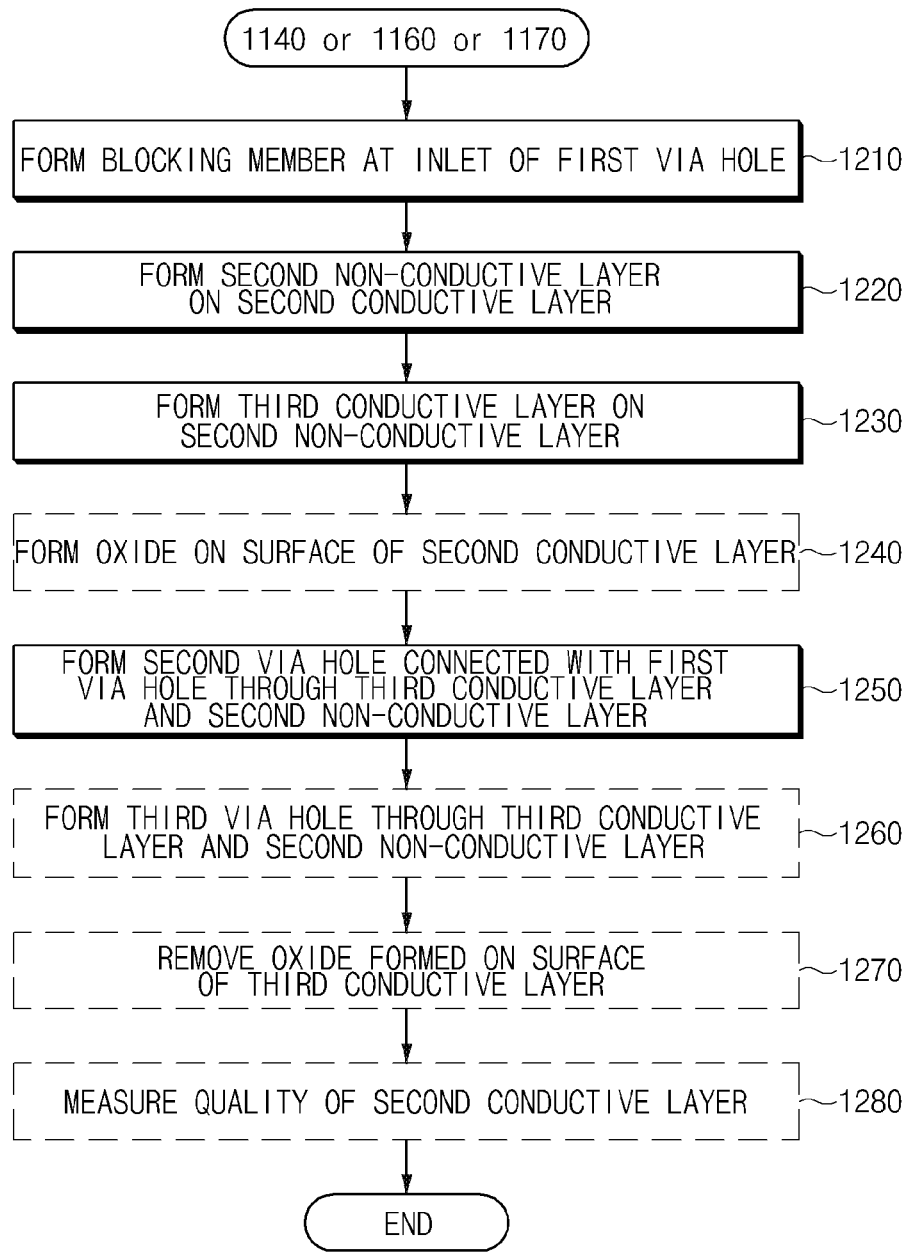

FIG. 12 is a flowchart illustrating a method of manufacturing a printed circuit board according to various embodiments of the disclosure.

The flowchart illustrated in FIG. 12 may be performed after process 1140, process 1160, or process 1170 of FIG. 11. According to an embodiment, in process 1210, a blocking member may be formed at the inlet of the at least one first opening. For example, the inlet of the first opening may be blocked by attaching a film to the inlet of the first opening.

According to an embodiment, in process 1220, a second non-conductive layer may be formed on the second conductive layer. According to an embodiment, in process 1230, a third conductive layer may be formed on the second non-conductive layer.

According to an embodiment, in process 1240, an oxide (e.g., a copper oxide) may be formed on the surface of the third conductive layer. For example, black oxide or brown oxide treatment may be formed on the third conductive layer.

According to an embodiment, in process 1250, at least one second opening that is connected with the at least one first opening may be formed through the third conductive layer and the second non-conductive layer. For example, the first opening and the second opening may be connected by forming the second opening in a position corresponding to the at least one first opening. According to an embodiment, the at least one second opening may be formed by using a drill (e.g., an electric drill) or by using laser drilling. According to an embodiment, the blocking member formed in process 1010 may be removed by process 1250. An opening (e.g., the second opening 742 of FIG. 7) that has a second depth h2 may be formed by process 1250. According to an embodiment, in process 1250, the width of the second opening may be formed differently from the first opening. For example, the width of the second opening may be formed to be wider than the first opening. In the case where the width of the second opening is formed to be wider than the first opening, an opening (e.g., the opening 940 of FIG. 9) that has a step structure may be formed.

According to an embodiment, in process 1260, a third opening may be formed through the third conductive layer and the second non-conductive layer. For example, the third opening may be formed in a position that does not correspond to the at least one first opening. An opening (e.g., the first opening 741 of FIG. 7) that has a first depth h1 may be formed by process 1260. In the case of manufacturing a printed circuit board (e.g., the printed circuit board 600 of FIG. 6) that includes only the opening having the second depth h2, process 1260 may be omitted.

According to an embodiment, in process 1270, the oxide formed on the surface of the third conductive layer may be removed. For example, the oxide formed on the surface of the third conductive layer may be removed through a pickling and/or rinsing process. According to an embodiment, process 1240 serves to prevent a laser from being diffusely reflected from the surface of a conductive layer when laser drilling is used, and process 1240 and process 1270 may be omitted in the case of forming the second opening or the third opening using a drill.

According to an embodiment, in process 1280, the quality of the third conductive layer may be measured. For example, foreign matter contained in the second opening or the third opening formed through the second conductive layer may be inspected, or the widths and depths of the first opening, the antenna pattern, and the wiring pattern may be measured, through an automatic optical inspection (AOI) process or a process using a non-contact type micro-shape measurement device. According to an embodiment, process 1280 may be omitted.

The method of manufacturing the printed circuit board according to various embodiments of the disclosure, which has been described above with reference to FIGS. 11 and 12, may omit a plating process for an opening for measuring the quality of the printed circuit board, and therefore the opening may be empty inside. However, a via hole (a conductive via hole) for electrically connecting a plurality of conductive layers may be filled with a conductive material through a plating process.

Figure 13:
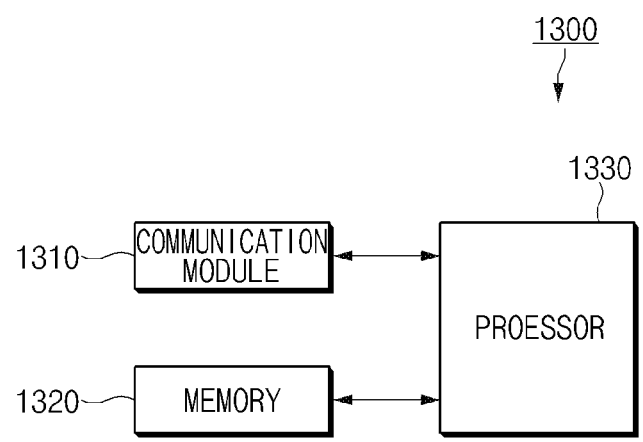
FIG. 13 is a block diagram illustrating a configuration of a quality measurement device according to various embodiments of the disclosure.

FIG. 13 is a block diagram illustrating a configuration of a quality measurement device according to various embodiments of the disclosure.

According to an embodiment, the quality measurement device 1300 may include a communication module (or, communication circuitry) 1310, a memory 1320, and a processor 1330. According to an embodiment, the quality measurement device 1300 may measure the qualities of the printed circuit boards by using the openings included in the printed circuit boards described above with reference to FIGS. 1 to 10.

According to an embodiment, the communication module 1310 may communicate with an external electronic device. For example, the communication module 1310 may transmit a command for measuring the qualities of the printed circuit boards to the external electronic device, or may receive measurement results using the openings included in the printed circuit boards from the external electronic device. According to an embodiment, the communication module 1310 may communicate with the external electronic device using a wired communication technology or a wireless communication technology.

According to an embodiment, the memory 1320 may store reference values and allowable values for measuring the qualities of the printed circuit boards. According to an embodiment, the memory 1320 may store a program or algorithm for measuring the qualities of the printed circuit boards.

According to an embodiment, the processor 1330 may control an overall operation of the quality measurement device. For example, the processor 1330 may measure the qualities of the printed circuit boards according to various embodiments of the disclosure by executing the program or algorithm stored in the memory 1320.

According to an embodiment, the processor 1330 may measure the qualities of the printed circuit boards using a non-contact type micro-shape measurement device (e.g., a three-dimensional non-contact type micro-shape measurement device). The processor 1330 may measure the depth value of at least one opening included in each printed circuit board by using the non-contact type micro-shape measurement device electrically (or, operatively) connected through the communication module 1310. For example, the processor 1330 may control the non-contact type micro-shape measurement device to measure the depth value of the at least one opening and may receive the measured depth value from the non-contact type micro-shape measurement device. According to an embodiment, the non-contact type micro-shape measurement device may measure the depth value included in the printed circuit board by using an interference signal included in light reflected from the printed circuit board. According to an embodiment, in the case where a plurality of openings are included in a printed circuit board, the non-contact type micro-shape measurement device may sequentially measure the depth values of the plurality of openings depending on a specified sequence according to control of the quality measurement device 1300.

According to an embodiment, the processor 1330 may measure the quality of the printed circuit board, based on the depth value measured. According to an embodiment, the processor 1330 may compare the measured depth value with a reference value stored in the memory 1320. The reference value may be a value corresponding to the depth of the opening in the case where there is no manufacturing tolerance. For example, in the case of measuring the quality of the printed circuit board 500 illustrated in FIG. 5, the depth value obtained by measuring the opening 540 formed through the first conductive layer 521 and the first non-conductive layer 531 may be compared with a first reference value (e.g., h1). In another example, in the case of measuring the quality of the printed circuit board 600 illustrated in FIG. 6, the depth value obtained by measuring the opening 640 formed through the first conductive layer 621, the first non-conductive layer 631, the second conductive layer 622, and the second non-conductive layer 632 may be compared with a second reference value (e.g., h2). In another example, in the case of measuring the quality of the printed circuit board 900 illustrated in FIG. 9, the plurality of depth values obtained by measuring the opening 940 formed through the first conductive layer 921, the first non-conductive layer 931, the second conductive layer 922, and the second non-conductive layer 932 may be compared with a plurality of reference values (e.g., a first reference value h1 and a third reference value h3). According to an embodiment, the processor 1330 may determine the printed circuit board to be a good product when the difference between the measured depth value and the reference value is less than or equal to an allowable value, and may determine the printed circuit board to be a bad product when the difference between the measured depth value and the reference value exceeds the allowable value. The allowable value may be a value that corresponds to a manufacturing tolerance that is allowable within a range not affecting the performance of an antenna included in the printed circuit board and may vary depending on the position or depth of the opening.

According to an embodiment, in the case where a printed circuit board includes a plurality of openings formed to different depths, the processor 1330 may measure the depth value of a first opening formed to a first depth and may measure the depth value of a second opening formed to a second depth. According to an embodiment, the processor 1330 may compare the depth value of the first opening with a first reference value and may compare the depth value of the second opening with a second reference value. For example, in the case of measuring the quality of the printed circuit board 700 illustrated in FIG. 7, the depth value obtained by measuring the first opening 741 may be compared with the first reference value (e.g., h1), and the depth value obtained by measuring the second opening 742 may be compared with the second reference value (e.g., h2). In another example, in the case of measuring the quality of the printed circuit board 800 illustrated in FIG. 8, the depth value obtained by measuring the first opening 841 may be compared with the first reference value (e.g., h1), and the depth value obtained by measuring the second opening 842 may be compared with a third reference value (e.g., h3). According to an embodiment, the processor 1330 may identify the difference value between the depth value of the second opening and the depth value of the first opening and may compare the difference value with the third reference value. The processor 1330 may determine the printed circuit board to be a good product when the difference between the difference value and the third reference value is less than or equal to an allowable value, and may determine the printed circuit board to be a bad product when the difference between the difference value and the third reference value exceeds the allowable value.

According to an embodiment, in the case where a printed circuit board includes a plurality of openings, the processor 1330 may determine the printed circuit board to be a good product when quality measurement results by a specified percentage (e.g., 90%) or more of openings among the plurality of openings are determined to be good. According to an embodiment, in the case where a printed circuit board includes a plurality of openings formed to the same depth, the processor 1330 may determine the quality of the printed circuit board by using a representative value (e.g., an average value) of the depth values of the plurality of openings.

According to an embodiment, the processor 1330 may measure the quality of a printed circuit board by using a probe device electrically (or, operatively) connected through the communication module 1310. According to an embodiment, the probe device may include a plurality of pogo pins configured to make contact with different conductive layers. For example, in the case of measuring the quality of the printed circuit board 500 illustrated in FIG. 5, the probe device may include a first pogo pin configured to make contact with the first conductive layer 521 and a second pogo pin configured to be inserted into the opening 540 to make contact with the second conductive layer 522. The lengths of the first pogo pin and the second pogo pin may have a difference corresponding to the depth of the opening. According to an embodiment, each of the plurality of pogo pins may be extended or reduced by a length corresponding to half of an allowable value (a value corresponding to an allowable manufacturing tolerance). For example, in the case where the depth of the opening is beyond the manufacturing tolerance, one of the plurality of pogo pins may fail to make contact with a conductive layer even though the lengths of the plurality of pogo pins are extended or reduced. According to an embodiment, the processor 1330 may control the probe device to perform a continuity (open/short) test. According to an embodiment, in the case where a plurality of openings are included in a printed circuit board, the probe device may sequentially perform a continuity test on the plurality of openings according to control of the quality measurement device 1300.

According to an embodiment, the processor 1330 may measure the quality of a printed circuit board, based on whether a current is passed through the printed circuit board. For example, the processor 1330 may determine the printed circuit board to be a good product when a short state is determined, and may determine the printed circuit board to be a bad product when an open state is determined.

According to an embodiment, in the case where a printed circuit board includes a plurality of openings, the processor 1330 may determine the printed circuit board to be a good product when quality measurement results by a specified percentage (e.g., 90%) or more of openings among the plurality of openings are determined to be good. Various embodiments of the disclosure may include a method of determining the quality of a printed circuit board using the above-described quality measurement device 1300.

FIG. 14 is a block diagram illustrating an electronic device 1401 in a network environment 1400 according to various embodiments.

Referring to FIG. 14, the electronic device 1401 in the network environment 1400 may communicate with an electronic device 1402 via a first network 1498 (e.g., a short-range wireless communication network), or an electronic device 1404 or a server 1408 via a second network 1499 (e.g., a long-range wireless communication network). According to an embodiment, the electronic device 1401 may communicate with the electronic device 1404 via the server 1408. According to an embodiment, the electronic device 1401 may include a processor 1420, memory 1430, an input device 1450, a sound output device 1455, a display device 1460, an audio module 1470, a sensor module 1476, an interface 1477, a haptic module 1479, a camera module 1480, a power management module 1488, a battery 1489, a communication module 1490, a subscriber identification module (SIM) 1496, or an antenna module 1497. In some embodiments, at least one (e.g., the display device 1460 or the camera module 1480) of the components may be omitted from the electronic device 1401, or one or more other components may be added in the electronic device 1401. In some embodiments, some of the components may be implemented as single integrated circuitry. For example, the sensor module 1476 (e.g., a fingerprint sensor, an iris sensor, or an illuminance sensor) may be implemented as embedded in the display device 1460 (e.g., a display).

The processor 1420 may execute, for example, software (e.g., a program 1440) to control at least one other component (e.g., a hardware or software component) of the electronic device 1401 coupled with the processor 1420, and may perform various data processing or computation. According to one embodiment, as at least part of the data processing or computation, the processor 1420 may load a command or data received from another component (e.g., the sensor module 1476 or the communication module 1490) in volatile memory 1432, process the command or the data stored in the volatile memory 1432, and store resulting data in non-volatile memory 1434. According to an embodiment, the processor 1420 may include a main processor 1421 (e.g., a central processing unit (CPU) or an application processor (AP)), and an auxiliary processor 1423 (e.g., a graphics processing unit (GPU), an image signal processor (ISP), a sensor hub processor, or a communication processor (CP)) that is operable independently from, or in conjunction with, the main processor 1421. Additionally or alternatively, the auxiliary processor 1423 may be adapted to consume less power than the main processor 1421, or to be specific to a specified function. The auxiliary processor 1423 may be implemented as separate from, or as part of the main processor 1421.

The auxiliary processor 1423 may control at least some of functions or states related to at least one component (e.g., the display device 1460, the sensor module 1476, or the communication module 1490) among the components of the electronic device 1401, instead of the main processor 1421 while the main processor 1421 is in an inactive (e.g., sleep) state, or together with the main processor 1421 while the main processor 1421 is in an active state (e.g., executing an application). According to an embodiment, the auxiliary processor 1423 (e.g., an image signal processor or a communication processor) may be implemented as part of another component (e.g., the camera module 1480 or the communication module 1490) functionally related to the auxiliary processor 1423. The memory 1430 may store various data used by at least one component (e.g., the processor 1420 or the sensor module 1476) of the electronic device 1401. The various data may include, for example, software (e.g., the program 1440) and input data or output data for a command related thererto. The memory 1430 may include the volatile memory 1432 or the non-volatile memory 1434.

The program 1440 may be stored in the memory 1430 as software, and may include, for example, an operating system (OS) 1442, middleware 1444, or an application 1446.

The input device 1450 may receive a command or data to be used by other component (e.g., the processor 1420) of the electronic device 1401, from the outside (e.g., a user) of the electronic device 1401. The input device 1450 may include, for example, a microphone, a mouse, a keyboard, or a digital pen (e.g., a stylus pen).

The sound output device 1455 may output sound signals to the outside of the electronic device 1401. The sound output device 1455 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1460 may visually provide information to the outside (e.g., a user) of the electronic device 1401. The display device 1460 may include, for example, a display, a hologram device, or a projector and control circuitry to control a corresponding one of the display, hologram device, and projector. According to an embodiment, the display device 1460 may include touch circuitry adapted to detect a touch, or sensor circuitry (e.g., a pressure sensor) adapted to measure the intensity of force incurred by the touch.

The audio module 1470 may convert a sound into an electrical signal and vice versa. According to an embodiment, the audio module 1470 may obtain the sound via the input device 1450, or output the sound via the sound output device 1455 or a headphone of an external electronic device (e.g., an electronic device 1402) directly (e.g., wiredly) or wirelessly coupled with the electronic device 1401.

The sensor module 1476 may detect an operational state (e.g., power or temperature) of the electronic device 1401 or an environmental state (e.g., a state of a user) external to the electronic device 1401, and then generate an electrical signal or data value corresponding to the detected state. According to an embodiment, the sensor module 1476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1477 may support one or more specified protocols to be used for the electronic device 1401 to be coupled with the external electronic device (e.g., the electronic device 1402) directly (e.g., wiredly) or wirelessly. According to an embodiment, the interface 1477 may include, for example, a high definition multimedia interface (HDMI), a universal serial bus (USB) interface, a secure digital (SD) card interface, or an audio interface.

A connecting terminal 1478 may include a connector via which the electronic device 1401 may be physically connected with the external electronic device (e.g., the electronic device 1402). According to an embodiment, the connecting terminal 1478 may include, for example, a HDMI connector, a USB connector, a SD card connector, or an audio connector (e.g., a headphone connector).

The haptic module 1479 may convert an electrical signal into a mechanical stimulus (e.g., a vibration or a movement) or electrical stimulus which may be recognized by a user via his tactile sensation or kinesthetic sensation. According to an embodiment, the haptic module 1479 may include, for example, a motor, a piezoelectric element, or an electric stimulator.

The camera module 1480 may capture a still image or moving images. According to an embodiment, the camera module 1480 may include one or more lenses, image sensors, image signal processors, or flashes.

The power management module 1488 may manage power supplied to the electronic device 1401. According to one embodiment, the power management module 1488 may be implemented as at least part of, for example, a power management integrated circuit (PMIC).

The battery 1489 may supply power to at least one component of the electronic device 1401. According to an embodiment, the battery 1489 may include, for example, a primary cell which is not rechargeable, a secondary cell which is rechargeable, or a fuel cell.

The communication module 1490 may support establishing a direct (e.g., wired) communication channel or a wireless communication channel between the electronic device 1401 and the external electronic device (e.g., the electronic device 1402, the electronic device 1404, or the server 1408) and performing communication via the established communication channel. The communication module 1490 may include one or more communication processors that are operable independently from the processor 1420 (e.g., the application processor (AP)) and supports a direct (e.g., wired) communication or a wireless communication. According to an embodiment, the communication module 1490 may include a wireless communication module 1492 (e.g., a cellular communication module, a short-range wireless communication module, or a global navigation satellite system (GNSS) communication module) or a wired communication module 1494 (e.g., a local area network (LAN) communication module or a power line communication (PLC) module). A corresponding one of these communication modules may communicate with the external electronic device via the first network 1498 (e.g., a short-range communication network, such as Bluetooth™, wireless-fidelity (Wi-Fi) direct, or infrared data association (IrDA)) or the second network 1499 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 1492 may identify and authenticate the electronic device 1401 in a communication network, such as the first network 1498 or the second network 1499, using subscriber information (e.g., international mobile subscriber identity (IMSI)) stored in the subscriber identification module 1496.

The antenna module 1497 may transmit or receive a signal or power to or from the outside (e.g., the external electronic device) of the electronic device 1401. According to an embodiment, the antenna module 1497 may include an antenna including a radiating element composed of a conductive material or a conductive pattern formed in or on a substrate (e.g., PCB). According to an embodiment, the antenna module 1497 may include a plurality of antennas. In such a case, at least one antenna appropriate for a communication scheme used in the communication network, such as the first network 1498 or the second network 1499, may be selected, for example, by the communication module 1490 (e.g., the wireless communication module 1492) from the plurality of antennas. The signal or the power may then be transmitted or received between the communication module 1490 and the external electronic device via the selected at least one antenna. According to an embodiment, another component (e.g., a radio frequency integrated circuit (RFIC)) other than the radiating element may be additionally formed as part of the antenna module 1497.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1401 and the external electronic device 1404 via the server 1408 coupled with the second network 1499. Each of the electronic devices 1402 and 1404 may be a device of a same type as, or a different type, from the electronic device 1401. According to an embodiment, all or some of operations to be executed at the electronic device 1401 may be executed at one or more of the external electronic devices 1402, 1404, or 1408. For example, if the electronic device 1401 should perform a function or a service automatically, or in response to a request from a user or another device, the electronic device 1401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1401. The electronic device 1401 may provide the outcome, with or without further processing of the outcome, as at least part of a reply to the request. To that end, a cloud computing, distributed computing, or client-server computing technology may be used, for example.

The printed circuit boards 100, 200, 400, 500, 600, 700, 800, and 900 according to various embodiments of the disclosure may be included in the electronic device 1401. In this case, the communication module 1490 may transmit/receive signals in a specified frequency band (e.g., 28 GHz) by supplying power to the printed circuit boards 100, 200, 400, 500, 600, 700, 800, and 900.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1440) including one or more instructions that are stored in a storage medium (e.g., internal memory 1436 or external memory 1438) that is readable by a machine (e.g., the electronic device 1401). For example, a processor(e.g., the processor 1420) of the machine (e.g., the electronic device 1401) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A printed circuit board comprising:
a plurality of layers in which at least one opening is formed, the at least one opening is empty inside; and
at least one antenna included in at least one layer among the plurality of layers,
wherein the at least one opening is formed through at least one of the plurality of layers and is formed to open to an upper surface of the printed circuit board.

2. The printed circuit board of claim 1, wherein the plurality of layers include a plurality of conductive layers and a plurality of non-conductive layers disposed between the plurality of conductive layers, and wherein the antenna is included in at least one layer among the plurality of conductive layers.

3. The printed circuit board of claim 2, wherein the plurality of conductive layers include a first conductive layer disposed on an upper surface of the printed circuit board, a second conductive layer disposed below the first conductive layer, and a third conductive layer disposed below the second conductive layer, and wherein the non-conductive layers include a first non-conductive layer disposed between the first conductive layer and the second conductive layer and a second non-conductive layer disposed between the second conductive layer and the third conductive layer.

4. The printed circuit board of claim 3, wherein the at least one antenna is included in the second conductive layer.

5. The printed circuit board of claim 3, wherein the at least one opening is formed through the first conductive layer and the first non-conductive layer.

6. The printed circuit board of claim 3, wherein the at least one opening includes at least one first opening formed through the first conductive layer and the first non-conductive layer and at least one second opening formed through the first conductive layer, the first non-conductive layer, the second conductive layer, and the second non-conductive layer.

7. The printed circuit board of claim 1, wherein the at least one antenna includes at least one dipole antenna and at least one patch antenna.

8. The printed circuit board of claim 1, wherein the at least one antenna is configured to operate in a 5th generation (5G) frequency band.

9. A device for measuring quality of the printed circuit board of claim 1, the device comprising:
communication circuitry configured to communicate with an external electronic device;
a memory; and
a processor electrically connected with the communication circuitry and the memory,
wherein the processor is configured to measure the quality of the printed circuit board using the at least one opening.

10. The device of claim 9, wherein the processor is configured to measure a depth value of the at least one opening using a non-contact type micro-shape measurement device connected through the communication circuitry and to measure the quality of the printed circuit board based on the measured depth value.

11. The device of claim 9, wherein the processor is configured to:
compare the measured depth value with a reference value; and
determine the printed circuit board to be a good product when a difference between the measured depth value and the reference value is less than or equal to an allowable value and determine the printed circuit board to be a bad product when the difference between the measured depth value and the reference value exceeds the allowable value.

12. The device of claim 9, wherein the processor is configured to:
measure a depth value of a first opening formed to have a first depth and a depth value of a second opening formed to have a second depth, by using a non-contact type micro-shape measurement device connected through the communication circuitry;
identify a difference value between the depth value of the second opening and the depth value of the first opening;
compare the difference value with a third reference value; and
determine the printed circuit board to be a good product when a difference between the difference value and the third reference value is less than or equal to an allowable value and determine the printed circuit board to be a bad product when the difference between the difference value and the third reference value exceeds the allowable value.

13. The device of claim 9, wherein the at least one opening includes a plurality of openings, and
wherein the processor is configured to measure the quality of the printed circuit board using a representative value of depth values of the plurality of openings.

14. The device of claim 9, wherein the process is configured to measure the quality of the printed circuit board using a probe device including a first pogo pin configured to make contact with a first layer and a second pogo pin configured to be inserted into the opening to make contact with a second layer.

* * * * *